(12) United States Patent
Bush et al.

(10) Patent No.: US 12,712,343 B2
(45) Date of Patent: Aug. 18, 2026

(54) INFRASTRUCTURE MONITORING AND INSPECTION

(71) Applicant: Florida Power & Light Company, Juno Beach, FL (US)

(72) Inventors: Kyle A. Bush, Palm Beach Gardens, FL (US); Guillermo Aleman, Miami, FL (US); Eric D. Schwartz, Palm Beach Gardens, FL (US); Michael L. Wenell, Jupiter, FL (US); Troy D. Freissle-Lewis, Tampa, FL (US); Christopher H. McLemore, Jupiter, FL (US)

(73) Assignee: Florida Power & Light Company, Juno Beach, FL (US)

( * ) Notice: Subject to any disclaimer, the term of this patent is extended or adjusted under 35 U.S.C. 154(b) by 27 days.

(21) Appl. No.: 18/424,045

(22) Filed: Jan. 26, 2024

(65) Prior Publication Data

US 2025/0246882 A1 Jul. 31, 2025

(51) Int. Cl.

| | |
|---|---|
| ***H02G 1/02*** | (2006.01) |
| ***B64U 10/14*** | (2023.01) |
| ***B64U 101/31*** | (2023.01) |
| ***G01R 31/08*** | (2020.01) |

(52) U.S. Cl.

CPC ............... *H02G 1/02* (2013.01); *B64U 10/14* (2023.01); *G01R 31/085* (2013.01); *B64U 2101/31* (2023.01); *B64U 2201/20* (2023.01)

(58) Field of Classification Search

CPC ...... H02G 1/02; B64U 10/14; B64U 2101/31; B64U 2201/20; G01R 31/085

See application file for complete search history.

(56) References Cited

U.S. PATENT DOCUMENTS

| | | | |
|---|---|---|---|
| 4,818,990 | A | 4/1989 | Fernandes |
| 8,511,606 | B1 | 8/2013 | Lutke et al. |
| 9,439,092 | B1 | 9/2016 | Chukka et al. |
| 9,716,971 | B2 | 7/2017 | Steiger et al. |

(Continued)

FOREIGN PATENT DOCUMENTS

| | | | | |
|---|---|---|---|---|
| BR | 102016008991 A2 * | 10/2016 | ............. | G01R 31/50 |
| CN | 101807080 | 8/2010 | | |

(Continued)

OTHER PUBLICATIONS

Ayoub, N., & Schneider-Kamp, P. (Jul. 2020). “Real-time On-board Detection of Components and Faults in an Autonomous UAV System for Power Line Inspection”, In DeLTA (pp. 68-75).

(Continued)

*Primary Examiner* — Rufus C Point

(74) *Attorney, Agent, or Firm* — TROUTMAN PEPPER LOCKE LLP; Dustin B. Weeks

(57) ABSTRACT

Systems and methods of monitoring infrastructure systems. Indications of problem reports are received and analyzed to determine an estimated location of a problem in an infrastructure system. Based on analyzing the indications, a selected drone that is pre-deployed at a location near the estimated location is selected. Operations of the selected drone are remotely control, based on determining the selected drone, to inspect an area or equipment in a vicinity of the estimated location of the problem.

17 Claims, 6 Drawing Sheets

(56) References Cited

U.S. PATENT DOCUMENTS

| | | | | |
|---|---|---|---|---|
| 9,753,461 | B1 | 9/2017 | Johnson et al. | |
| 9,910,102 | B2 | 3/2018 | Stoupis et al. | |
| 10,053,218 | B2 | 8/2018 | Feldmann et al. | |
| 10,203,701 | B2 | 2/2019 | Kurdi et al. | |
| 10,319,243 | B2 | 6/2019 | Kreiner et al. | |
| 10,365,646 | B1 * | 7/2019 | Farnsworth | G05D 1/0055 |
| 10,564,649 | B2 | 2/2020 | van Cruyningen | |
| 10,705,131 | B2 | 7/2020 | Vinogradova et al. | |
| 10,919,626 | B2 | 2/2021 | Jaugilas | |
| 11,358,717 | B2 | 6/2022 | Wabnegger et al. | |
| 11,626,729 | B1 | 4/2023 | Syracuse et al. | |
| 11,682,307 | B2 | 6/2023 | J et al. | |
| 2013/0233964 | A1 * | 9/2013 | Woodworth | B64U 10/60 244/175 |
| 2014/0316614 | A1 * | 10/2014 | Newman | B64U 30/24 705/26.4 |
| 2017/0092109 | A1 * | 3/2017 | Trundle | G05D 1/104 |
| 2018/0314994 | A1 | 11/2018 | Katz et al. | |
| 2019/0114725 | A1 | 4/2019 | Neuenschwander | |
| 2021/0126582 | A1 | 4/2021 | Shue et al. | |
| 2021/0173414 | A1 * | 6/2021 | Starr | G08G 5/56 |
| 2022/0157180 | A1 | 5/2022 | Singh et al. | |
| 2023/0044197 | A1 | 2/2023 | Sunder et al. | |
| 2023/0368095 | A1 * | 11/2023 | Armstrong | G06Q 40/08 |
| 2025/0029480 | A1 * | 1/2025 | Kereszy | G08B 31/00 |

FOREIGN PATENT DOCUMENTS

| | | |
|---|---|---|
| CN | 102941920 | 2/2013 |
| KR | 20230035957 | 3/2023 |
| WO | 2022038220 | 2/2022 |

OTHER PUBLICATIONS

Kitchen, R., Bierwolf, N., Harbertson, S., Platt, B., Owen, D., Griessmann, K., & Minor, M. A. (Oct. 2020). “Design and evaluation of a perching hexacopter drone for energy harvesting from power lines”, In 2020 IEEE/RSJ International Conference on Intelligent Robots and Systems (IROS) (pp. 1192-1198). IEEE.

Li, L. (Apr. 2015). “The UAV intelligent inspection of transmission lines. In Proceedings of the 2015 International Conference on Advances in Mechanical Engineering and Industrial Informatics” (pp. 1542-1545). Atlantis Press.

Li, Z., Zhang, Y., Wu, H., Suzuki, S., Namiki, A., & Wang, W. (2023). “Design and Application of a UAV Autonomous Inspection System for High-Voltage Power Transmission Lines. Remote Sensing”, 15(3), 865.

Schofield, O. B., Lorenzen, K. H., & Ebeid, E. (Aug. 2020). “Cloud to cable: A drone framework for autonomous power line inspection. In 2020 23rd Euromicro Conference on Digital System Design”, (DSD) (pp. 503-509). IEEE.

Zormpas, A., Moirogiorgou, K., Kalaitzakis, K., Plokamakis, G. A., Partsinevelos, P., Giakos, G., & Zervakis, M. (Oct. 2018). “Power transmission lines inspection using properly equipped unmanned aerial vehicle (UAV). In 2018 IEEE international conference on imaging systems and techniques”, (IST) (pp. 1-5). IEEE.

Saava, “ICARUS: automatic autonomous power infrastructure inspection with UAVs”, 2021 International Conference on Unmanned Aircraft Systems (ICUAS). IEEE, 2021.

* cited by examiner

INFRASTRUCTURE MONITORING AND INSPECTION

FIELD OF THE DISCLOSURE

The present disclosure generally relates to instrumentation of infrastructure system operations, and more particularly to monitoring and inspecting causes of reported events.

BACKGROUND

The maintenance and operations of large-scale physical systems, such as electrical power transmission and distribution systems, include monitoring and inspection of the equipment within those systems. In general, such systems include monitoring equipment determine the operational status of those systems and detect abnormalities or faults in the operations of those systems. Abnormalities or faults are able to be determined by various means including reporting by equipment installed in the operating system, reports from users of the infrastructure such as electric power consumers, other techniques, or combinations of these. Determined or reported abnormalities generally result in dispatching trained personnel to perform a physical inspection in order to assess conditions that caused the indication, make repairs or adjustments, or determine further actions to address the situation.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
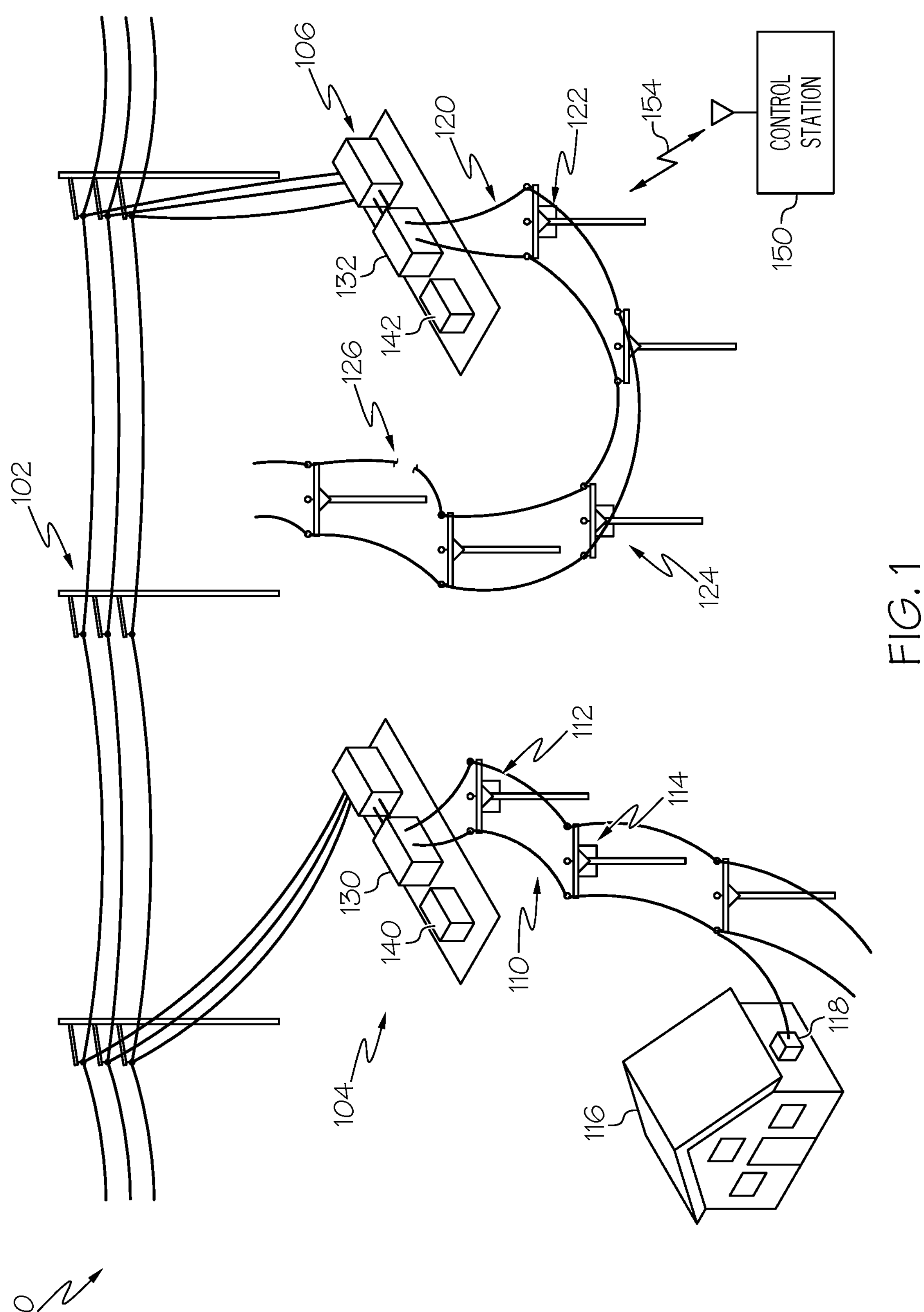
FIG. 1 illustrates a portion of an electric power distribution system, according to an example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function.

The below described example systems and methods operate to detect problems in one or more infrastructure systems, such as electric power transmission and distributions systems, and to more efficiently react to the detection of those problems. In an example, a problem is able to be detected based on a determination of problems or faults within those systems by various monitoring devices. In an example, the monitoring devices are able to estimate a location of the problem and a reaction to such a detected problem is able to include more efficiently performing inspections of an area around the estimated locations of the detected problem.

In an example, such infrastructure systems are designed or modified to include monitoring equipment to detect and report problems such as faults or problems of various natures. In the following discussion, problems with infrastructure systems is to be broadly understood to include any problem such as, but without limitation, faults in electrical systems, other problems, or combinations of these. In an example of an electrical power transmission or distribution system, such systems are able to include, for example, electrical current monitoring equipment at various facilities within the system that are able to detect faults or problems, and provide estimates of the location of the fault or problem in the system.

Systems that are configured or adapted to support monitoring to detect and estimate locations of problems are able to include equipment located at various locations in or appurtenant to the system such as Fault Circuit Indicators (FCIs), other equipment, or combinations of these. Such equipment in some examples is able to provide estimates of a distance down a transmission or distribution power line from the monitoring equipment to a location of a detected fault or problem with that transmission or distribution line. Other techniques include operations centers that monitor reports from various sources, such as from smart electrical meters installed at customer premises or reports made by customers, to provide an indication of areas of an electrical distribution system that has abnormal operations or no electrical power. In some cases, monitoring equipment may provide an estimate of a location of problems or fault as a distance along a power distribution line from a location of a sensor or other location. Such location information is able to be combined with a geographic map of the electrical distribution system to provide an estimate of a location of a detected problem. In some examples, problem reports, estimated locations of problems, reports made by different systems, various other information, or combinations of these, are able to be combined into an integrated probability distribution of a location of a problem or fault within an electrical distribution system.

The below described systems and methods in an example include installation of remotely controlled Unmanned Aerial Vehicles (UAVs) or other remotely controlled devices at various locations around a monitored infrastructure system and automatically assisting in the dispatch of one or more of those UAVs or other remotely controlled devices in response to a detected problem or fault. In the following discussion, the term drone is used to broadly refer to any remotely controlled device such as a UAV or other remotely controlled device. In an example, probable locations of a problem or fault in an electrical distribution system are determined and an inspection mission to be performed by a UAV or other remotely controlled device is automatically generated in some examples to inspect those probable locations.

Monitoring systems to detect, report, and estimate the location of a problem or fault in some examples generate and report indications of a problem. In some examples, these indications are received by a processor and the information contained in those indications, such as information contained in one or more of customer generated complaint work requests, system generated alarms/warnings, other reports, or combinations of these, is analyzed to provide an integrated probability distribution of an estimated location of the problem or fault. In general, estimated locations of a detected problem are able to be determined by any suitable analysis.

In an example, a pre-deployed UAV or other remotely controlled device is able to be selected and dispatched to inspect an area around an estimated location of the problem or fault. Dispatching a UAV or other remotely controlled device to inspect areas around locations in the electrical distribution system that are estimated locations of the detected problem or fault advantageously replaces providing a more general trouble ticket to a worker who is then dispatched to drive around the area of the estimated locations of the problem or fault to inspect the system.

In an example, processing by the below described systems and methods is able to determine an efficient device routing for the inspection mission. Once selected, a remotely controlled device, such as a UAV, is able to be dispatched to inspect the area around the estimated location. In various examples, a remotely controlled device refers to any device that is able to have its operations either initiated, controlled, or both by a remote system. In some examples, the dispatched remotely controlled device is able to be remotely controlled by an operator who is remotely located from the device such as is located at a central control station. In other examples, a remotely controlled device is able to have its operations remotely controlled by only being remotely dispatched based on being programmed with a task, such as a specification of one or more of: an area to inspect, a route to take to inspect an area, other tasking, or combinations of these. In some examples a remotely controlled device is able to have one or more of total remote control operations, fully autonomous operations, autonomous operation with some input by an operator, or combinations of these.

The remotely controlled device in an example is able to collect observation data, such as images, videos, data from other sensors, or combinations of these, and communicate that observation data to a control station. The observation data is able to be analyzed to determine details of the detected problem. In some examples a report is generated based on the receipt and analysis of the observation data produced by the remotely controlled device during the inspection by the UAV or other remotely controlled device of the area around the estimated location of the problem. Such a report is able to provide further details to create a more complete trouble ticket to direct remedial actions.

FIG. 1 illustrates a portion of an electric power distribution system 100, according to an example. The portion of an electric power distribution system 100 depicts a transmission line 102 which provides power to two (2) power substations, a first substation 104 and a second substation 106. The portion of an electric power distribution system 100 presents a simplified diagram to allow a clearer description of relevant aspects of the illustrated systems and methods. For example, each substation is shown as providing electricity to only a single distribution power line.

The distribution power lines in the illustrated example include various monitoring devices. Illustrated monitoring devices include a first monitoring system 130 installed at the first substation 104 and a second monitoring system 132 installed at the second substation 106. Such monitoring devices are able to consist of various equipment that operate to detect faults or other problems with the distribution power lines. Different installations in some examples are able to have different equipment as part of their installed monitoring system.

The first substation 104 is shown to provide electrical power to a first distribution line 110. The first distribution line 110 has a first monitoring device 112 at a respective location along the first distribution line 110 and a second monitoring device 114 at respective location further along the first distribution line 110. The first monitoring system 130 monitors and reports various operating parameters of the equipment in the first substation 104 and also the electrical power delivered to the first distribution line 110. The portion of an electric power distribution system 100 further shows that the first distribution line 110 provides electrical power to a house 116 with a smart meter 118. A single house 116 is depicted for conciseness where in general a number of homes and other electric utility customers are located at various locations along electrical distribution lines.

The second substation 106 is shown to provide electrical power to a second distribution line 120. The second distribution line 120 has a third monitoring device 122 at a respective location along the second distribution line 120 and a fourth monitoring device 124 at respective location along the second distribution line 120. The second substation 106 further has the second monitoring system 132 that monitors and reports various operating parameters of the equipment in the second substation 106 and also the electrical power delivered to the second distribution line 120.

In some examples, monitoring devices include components that are installed within or appurtenant to the electrical transmission or distribution system to remotely monitor electrical distribution system components via various techniques such as Supervisory Control and Data Acquisition (SCADA) systems or other communications systems. In various examples, some types of monitoring equipment are able to be installed in one or more of substations, along transmission lines, or at customer facilities. In some examples, the monitoring devices are able to communicate the status of the power lines being monitored, the status of equipment within the monitoring device, or combinations of these. Examples of monitoring equipment include, but are not limited to, devices referred to as Fault Current Indicators (FCI) that automatically detect and estimate the location of electrical faults within the electrical distribution system, automatic reclosers, Automatic Feeder Switches (AFS) that detect overcurrent conditions and operate to open electrical circuits to protect the electrical distribution system, other monitoring equipment, or combinations of these. Another type of monitoring devices includes components of a smart grid or Advanced Metering Infrastructure (AMI) system that operates to report power outages that are observed at smart meters such as at customer premises.

In some examples, various overcurrent protection devices are able to be installed at points on a distribution line. Such overcurrent protection devices such as protection relays, detect an overcurrent condition and then open to prevent electrical power from being carried beyond the point of the opened protection device by disconnecting the downstream portion of the distribution line from the part of the distribution line upstream from the protection device.

The location of a determined problem or fault is able to be estimated by identifying a protection device that has opened as is detected by, in an example, a monitoring device that is located downstream of the open protection device. The locations of monitoring devices and protection devices in an electrical power distribution system is able to be determined based on stored geographic locations of installed equipment. In an example, a location of a problem or fault is able to be estimated by determining the last monitoring device on a distribution line that is receiving electrical power and assuming the problem or fault is located past the location of the next protection device that is downstream from that last monitoring device and before the location, along the power distribution line, of the subsequent protection device that is downstream from that next protection device. Alternatively, or in conjunction with the above, the location of a determined problem or fault is also able to be estimated based upon reports of power outages and power presence at smart meters reporting via, for example, an AMI system. In general, any suitable technique for estimating the geographical area in which a determined problem or fault is located can be used to support the below described operations.

The first substation 104 has a first deployed UAV 140 and the second substation 106 has a second deployed UAV 142. These deployed UAVs 140, 142 are examples of pre-deployed drones that are pre-deployed at pre-deployment locations that are at their respective substations. The pre-deployment of these pre-deployed drones allows their rapid and efficient deployment to inspect and observe determined problems with the portion of an electric power distribution system 100. Although this example depicts UAVs being pre-deployed across this infrastructure of an electrical distribution system, it is to be understood that any type of remotely controlled vehicle, which are referred to as drones herein and include, without limitation, aerial vehicles, ground vehicles, other vehicles, or combinations of these, are able to be pre-deployed to various locations across an infrastructure and utilized in similar ways as described for the UAVs of this example.

The portion of an electric power distribution system 100 further depicts a control station 150. The control station 150 includes one or more of equipment, operators, operator positions, other facilities, or combinations thereof, to operate with estimated locations of determined problems or faults within the portion of an electric power distribution system 100 and control the operations of deployed UAVs 140, 142 to further inspect and observe portions of the portion of an electric power distribution system 100 that are determined to be near the estimated location of the determined problem or fault.

The depicted control station 150 includes a wireless communications system 152 that supports a wireless communications link 154. In various examples, the wireless communications link 154 is able to support communications with the deployed UAVs 140, 142 to control the flight and operation of the deployed UAVs 140, 142 and receive data collected during those flights and operations. The wireless communications link 154 is also able to provide communications with other systems, such as from SCADA systems, AMI systems, other monitoring systems, systems that receive or process data reported from such systems, or combinations of these. The illustrated wireless communications link 154 is shown as an example and various examples are able to have other equipment such as repeaters, etc., to implement a wide area communications link to control the flights and operations of a potentially large number of deployed UAVs across a large electrical distribution system. In further examples, the control station 150 is able to work with any number and variety of communications links to various locations to send, receive, or both send and receive various types and quantities of data.

The illustrated second distribution line 120 is shown to have a fault 126 located at a location past the fourth monitoring device 124. In an example, reports from the fourth monitoring device 124, along with report from the third monitoring device 122 and the second monitoring system 132 are processed to estimate a location of the fault 126 along the second distribution line 120. This location estimate is combined with geographic location data of the installed distribution lines, including the second distribution line 120, to determine the geographic location of the fault 126.

In this example, the portion of an electric power distribution system 100 shows that the geographic location of the fault 126 is close to the first substation 104 and thus the first deployed UAV 140. In an example where the fault 126 is located closer to the first substation 104 than to the second substation 106, it is more efficient to select the first deployed UAV 140 to inspect the fault 126 than the second deployed UAV 142 since the second substation 106 where it is deployed is farther than the first substation 104. In an example, the first deployed UAV will be selected upon receipt of an indication of a fault at the geographic location of the fault 126.

Figure 2:
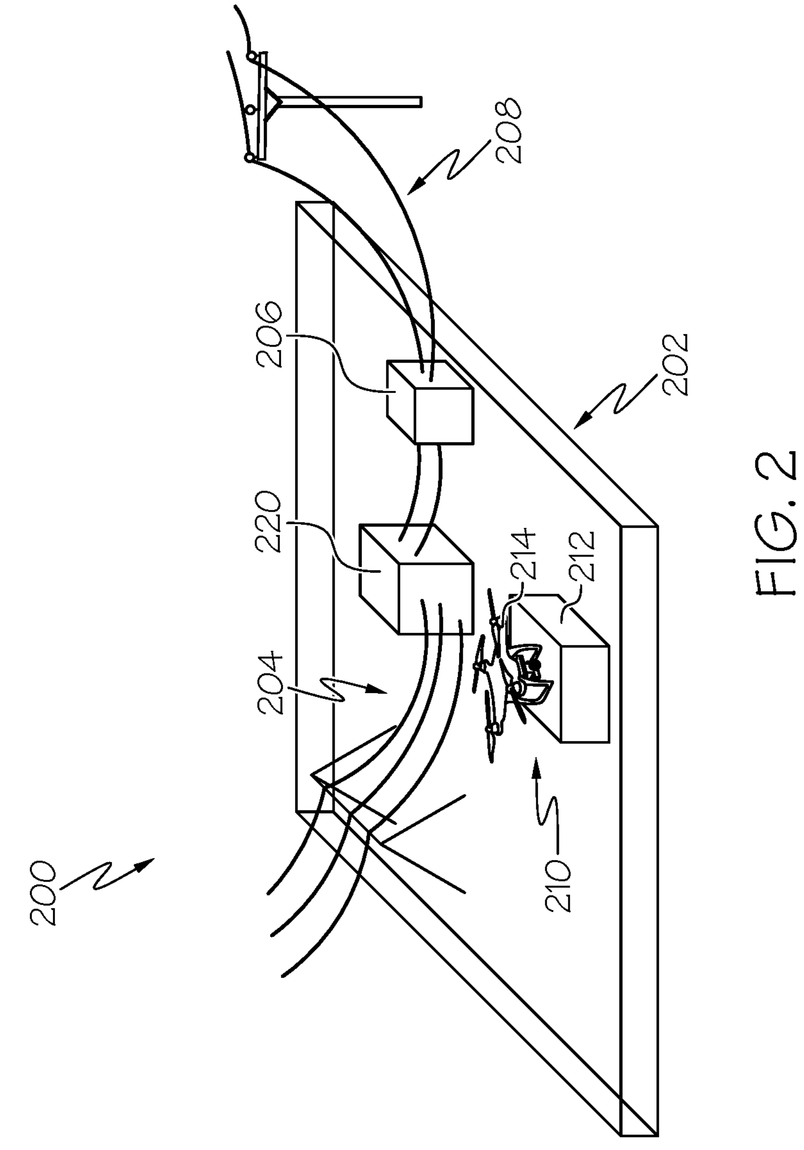
FIG. 2 illustrates an electric power distribution substation with an installed deployable UAV, according to an example.

FIG. 2 illustrates an electric power distribution substation with an installed deployable UAV 200, according to an example. The electric power distribution substation with an installed deployable UAV 200 illustrates an electrical distribution substation 202 that has an incoming transmission like 204 providing power to a transformer 220. The transformer 220 provides electrical power at distribution level voltages to monitoring equipment 206. The monitoring equipment is connected to an electrical distribution line 208 to provide electrical power to customers. The electrical distribution line 208 is similar to the above described first distribution line 110 and second distribution line 120. The monitoring equipment 206 is similar to the above described at least one monitoring device 130 132, and monitors the electrical power provided to the electrical distribution line 208 to detect faults or other problems.

The electric power distribution substation with an installed deployable UAV 200 includes an Unmanned Aerial Vehicle (UAV) installation 210 that includes a UAV landing pad 212 and shows a UAV 214 resting on the UAV landing pad 212. In some installations, a UAV installation 210 is able to include one or more enclosures (not shown) that encloses one or more UAVs that are located at the electrical distribution substation 202 to, for example, protect the UAVs from weather, other hazards, to provide various types of protections, or combinations of these.

Figure 3:
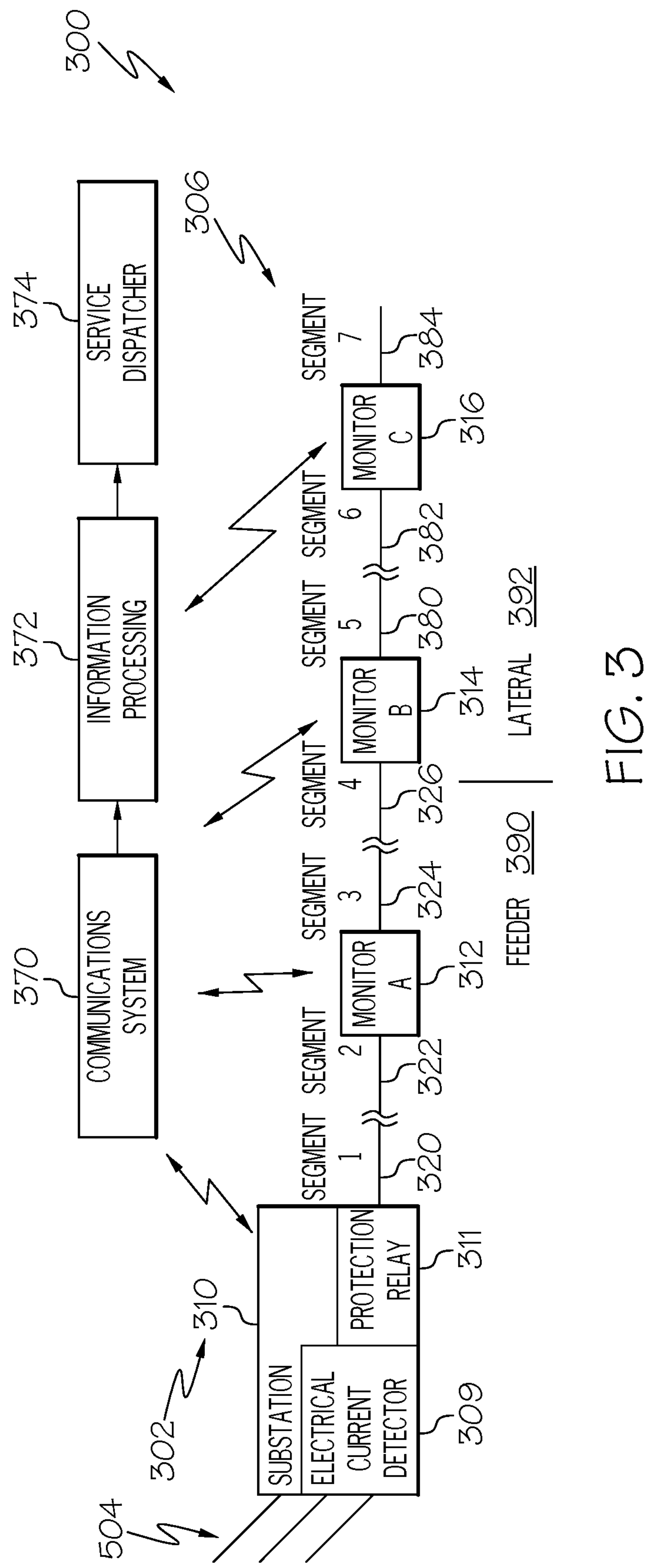
FIG. 3 illustrates an electrical distribution system with fault detection equipment, according to an example.

FIG. 3 illustrates an electrical distribution system with fault detection equipment 300, according to an example. The electrical distribution system with fault detection equipment 300 depicts a simplified electrical distribution system 302 that includes equipment to detect and aid in estimating locations of faults or other problems with the simplified electrical distribution system 302. The present description uses a simplified electrical distribution system 302 is similar to, for example, the above described first substation 104 and the first distribution line 110 and includes components to help more clearly and concisely describe the relevant aspects of the below described examples associated with detecting and estimating the locations of faults or other problems in order to facilitate the efficient dispatch of observation devices such as UAVs. It is clear that the principles and concepts described below can be readily applied to electrical distribution systems of any complexity.

The simplified electrical distribution system 302 depicts a substation 310 and an electrical distribution line 306 with a number of monitors distributed along that electrical distribution line 306. In an example, the substation 310 is able to be similar to the above described first substation 104. The illustrated electrical distribution line 306 is an example of an electrical line that has a number of electrical current monitors along its length. In general, a substation 310 receives electrical power from an electrical transmission system 304 and in turn provides electrical power to a number of feeder lines for distribution over a geographic area. These feeder lines in general each provide electrical power to a number of lateral lines that are connected to various points on the feeder line in order to further distribute electrical power over that geographical area. It is to be understood that the principles described below with regards to the electrical distribution line 306 are able to be easily and directly applied to an electrical distribution system that includes a number of substations that each provide power to a number of parallel feeder lines and where each feeder line provides power to a number of lateral lines connected to various points along those feeder lines.

The illustrated electrical distribution line 306 includes a number of monitors distributed along its path. These monitors, as are described below, in general contain electrical current monitors that perform various measurements of the electrical power conveyed along the electrical distribution line 306 and communicate those measurements via a communication system 370. In various examples, the communication system 370 is able to include one or more communications technologies that allow the various monitors to communicate data with remote devices. In various examples, the communications system 370 is able to include any combination of one or more of wired communications circuits, wireless communications circuits, other communications circuits, or any combination of these. In an example, the communications system 370 is able to include cellular data communications links, wired data communications links, Advanced Metering Infrastructure (AMI) communications elements, other elements or links, or any combination of these. The communications system 370 in some examples is similar to or has components similar to those included in the wireless communications system 152 described above.

The communications system 370 in an example provides data received from the various monitors and other systems to an information processing component 372. As is described in further detail below, the information processing component 372 includes various processors that perform various processing of data. In an example, the information processing component 372 is able to receive data reported via the communications system 370 to estimate locations of detected lines faults. In an example, the information processing component 372 includes a composite fault map processor that is able create a composite fault map as is described below. In an example, the information processing component 372 is similar to or part of the above described control station 150. Further details of an example information processing component 372 are provided below. The information processing component 372 in an example is then able to provide indications of detected faults or other problems to coordinate service operations such as dispatching of one or more UAVs to further inspect and observe areas around estimated locations of such detected faults or problems.

The substation 310 in this example has a protection relay 311 that connects the substation 310 to a first end of segment 1 320 of the electrical distribution line 306. The protection relay 311 in this example operates with an electrical current detector 309 that performs measurements of the electrical current provided to segment 1 320 and the other segments connected to segment 1 320. The electrical current detector 309 is able to, for example, detect an incidence of excessive electrical current being drawn by a load connected to the substation through the segment 1 320. An occurrence of an excessive amount of electrical current flowing through a conductor, which is generally defined as an amount of electrical current that exceeds a threshold, is referred to herein as an "overcurrent condition." Such an overcurrent condition is able to be associated with a line fault on the electrical circuit being provided with electrical power via segment 1 320. The electrical current detector 309 in an example records measurements of the electrical current surge associated with an overcurrent condition and commands the protection relay 311 to open and disconnect electrical power from segment 1 320 when an overcurrent condition is detected.

In some examples, electrical current detector 309 is able to include further processing or measurement equipment to produce various types of data to characterize the electrical current during an overcurrent condition. Examples of these different data that are able to be produced by the electrical current detector 309 include, but are not limited to, a detailed description of the electrical current peak transient during the overcurrent condition, alternating current (AC) electrical current phase shifts relative to the AC voltage waveform during the overcurrent condition, other measurements, or combinations of these. Such various types of data in some examples are able to support different line fault location estimation processing that may have different accuracies, reliability, other characteristics, or combinations of these.

The illustrated electrical distribution line 306 is a simplified depiction of an electrical line that includes a feeder line section 390 and a lateral line 392. As is understood by practitioners of ordinary skill in the relevant arts, a substation 310 is able to provide electrical power to number of feeder lines, and each feeder line is able to provide electrical power to a number of lateral lines that are connected at various locations along the feeder line. The illustrated electrical distribution line 306 is presented with this simplified structure in order to more concisely and clearly present the below described processing.

The illustrated feeder line section 390 includes segment 1 320, segment 2 322, segment 3 324 and segment 4 326. A monitor A 312 in this example connects segment 2 322 to segment 3 324. The illustrated lateral line 392 includes segment 5 380, segment 6 382 and segment 7 394. In this example, monitor B 314 connects segment 4 326 of the feeder line section 390 to segment 5 380 of the lateral line 392. Monitor C 316 connects segment 6 382 to segment 7

384 of the lateral line 392. Each segment in this context is a portion of an electrical line that is located at a particular location on the electrical line. In some examples, line fault location estimation processing assigns to each segment a likelihood, or probability, that a detected line fault occurred in that particular segment.

In the following discussion, segments, monitors, or other devices in an electrical line are referred to as being beyond or after one another, or as being before, preceding, or ahead of one another. These terms in general refer to the relative locations of an element to another element in a relative to the power source providing power to the electoral line. For example, with reference to the electrical distribution line 306, because of their relative locations to the substation 310 providing power to the electrical distribution line 306, monitor B 314 is referred to as being beyond or after monitor A 312, and preceding or ahead of monitor C 316.

The electrical distribution line 306 includes a number of monitors that perform electrical current measurements to support line fault location estimation. In the illustrated example, the electrical current detector 309 performs measurements that support location estimation of detected line faults anywhere on the electrical distribution line 306. Monitor A 312 performs measurements that support location estimation of detected line faults that occur beyond monitor A 312, such as within segment 3 324, segment 4, 326, segment 5 380, segment 6 382 or segment 7 384. Monitor B 314 performs measurements that support location estimation of detected line faults that occur beyond monitor B 314, such as within segment 5 380, segment 6 382 or segment 7 384. Monitor C 316 performs measurements that support location estimation of detected line faults that occur beyond monitor C 316, which includes segment 7 384 in this example. The electrical current detector 309, monitor A 312, monitor B 314, and monitor C 316 in the illustrated electrical distribution line 306 are examples of electrical current meters.

Electrical current monitors, such as are included in the electrical current detector 309, monitor A 312, monitor B 314, and monitor C 316, are able to include any electrical monitoring device that produces measurements of electrical current flow and reports such measurements via the communication system 370. In various examples, electrical current monitors are able to include various circuits that produce various measurements of electric current. In some examples, electrical current monitors are able to produce and report various types of measurements that support different processes to estimate locations of detected line faults. In some examples, without limitation, electrical current monitors are able to produce a detailed description of the electrical current peak transient during the overcurrent condition, alternating current (AC) electrical current phase shifts relative to the AC voltage waveform during the overcurrent condition, other measurements, or combinations of these.

In various examples, electrical current monitors are able to be any suitable device that is able to measure and report electrical current flowing through the device. By way of example and not limitation, monitors such as monitor A 312, monitor B 314, monitor C 316, other monitors, or combinations of these, are each able to include one or more of an Automatic Feeder Switch (AFS), an Automatic Lateral Switch (ALS), a Fault Current Indicator (FCI), other devices, or combinations of these.

Based on the above described processing, an estimation is able to be made of the geographic location of a detected fault or other problem. As noted above, monitoring equipment is able to estimate the distance along an electrical power distribution line from that monitoring equipment to a detected fault or other problem. In an example, this information is combined with geographic data indicating the locations of monitoring equipment and distribution line installations to estimate the geographic location of the estimated fault or other problem.

Figure 4:
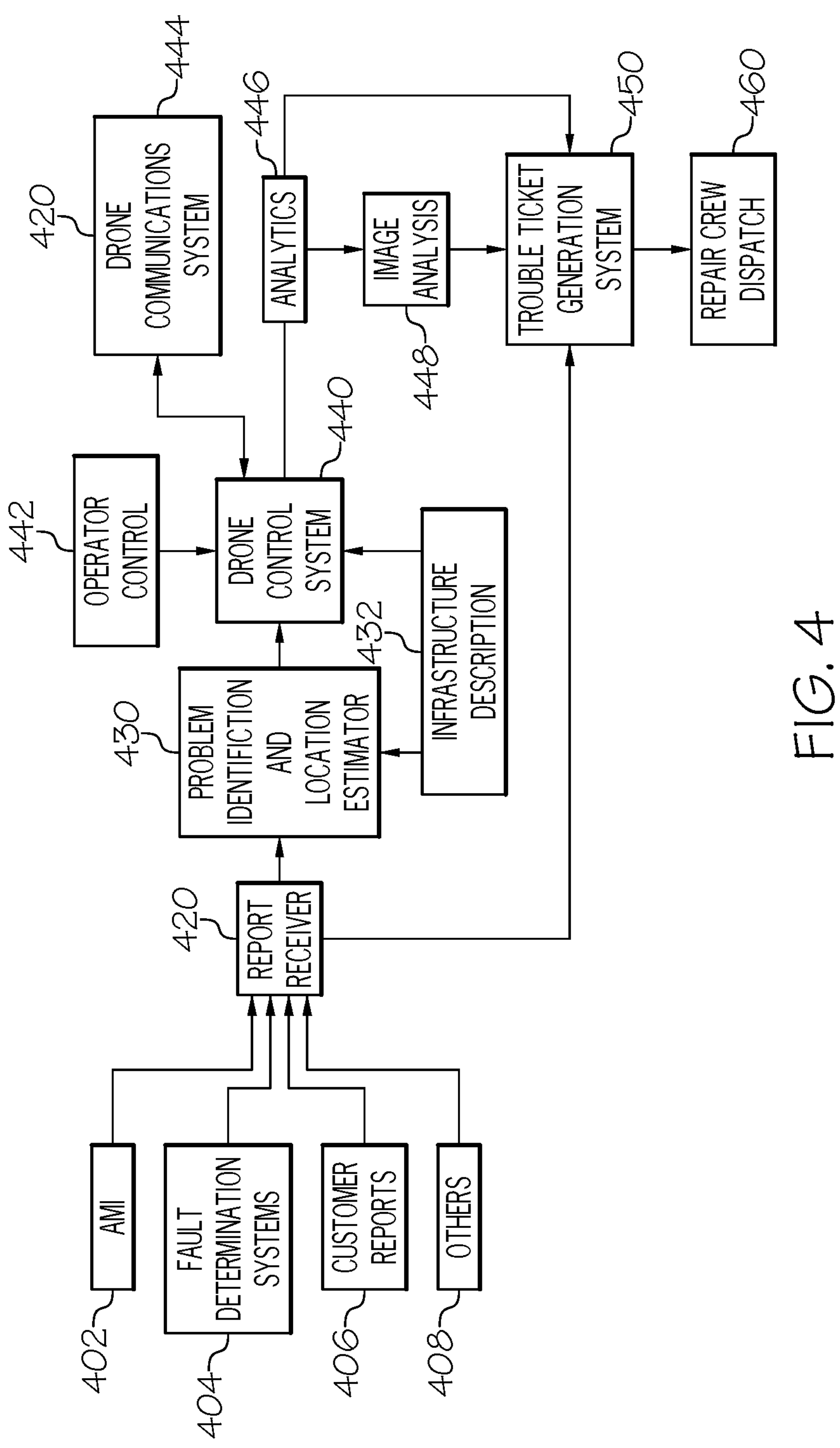
FIG. 4 illustrates a component diagram for an electrical distribution system monitoring system control center, according to an example.

FIG. 4 illustrates a component diagram for an electrical distribution system monitoring system control center 400, according to an example. The component diagram for an electrical distribution system monitoring system control center 400 depicts an example of an electrical power distribution system that includes equipment to detect and estimate locations of faults or other problems.

The component diagram for an electrical distribution system monitoring system control center 400 includes a number of sources of information regarding the operation of the electrical distribution system being monitored. In the illustrated example, such sources of information include an AMI reporting system 402, Fault detection systems 404, Customer reports 406, and other sources 408. In general, an electrical distribution system monitoring system control center is able to have any number of sources of information from which problems or faults in the electrical distribution system being monitored can be one or more of determined, identified, located, or combinations of these.

A report receiver 420 receives reports from the sources of information. The report receiver 420 in an example allows for the different formats of reports from the various sources of information to be received and processes in order to support further processing of that information.

A problem identification and location estimation process 430 in an example of a process containing a problem location estimation system that receives reports from the report receiver 420 and processes information contained in those reports to identify a problem indicated by the received reports and to also estimate a location within the monitored electrical distribution system of that identified problem. In some examples, such as with information produced by equipment within the above described electrical distribution system with fault detection equipment 300, information in received reports is able to indicate a location of a problem on a distribution power line as a distance along that distribution power line from a piece of equipment reporting the information indicating a problem.

An infrastructure description system 432, in an example, stores and provides information specifying the installed geographical layout of electrical distribution system equipment. In such an example, the problem identification and location estimation process 430 receives geographical layout information for electrical distribution system equipment and distribution power line runs from the infrastructure description system 432 and combines that information with estimated distance along that distribution power line to a detected fault as received from the fault detection systems 404 in order to determine an estimated geographical location of the detected fault.

A drone control system 440 is an example of an operations system that receives estimates of problem locations from the problem identification and location estimation process 430. As described above, the estimates of problem locations are produced by the problem identification and location estimation process 430 in an example are in the form of geographical coordinates that were determined based on estimating distances along a power line between measuring equipment and the detected problem. As such, the estimates of problem locations received by the drone control system 440 is likely to be near a power line. The drone control system 440 in an example automatically determines a pre-deployed drone to assign to the inspection of an area or equipment around the estimated location of the problem. Selection of a drone in an example is based on availability of unassigned drones closest to the estimated location of the detected problem. In an example, the drone control system 440 manages the assignment and utilization of all pre-deployed drones and is able to determine which drone is closest to the estimated location of the detected problem and is not assigned to other operations.

The drone control system 440 in some examples determines locations of pre-deployed drones based on location information received from the infrastructure description system 432. In an example, the infrastructure description system 432 stores information regarding the location of pre-deployed drones within an area of an infrastructure system.

Once the drone control system 440 determines a pre-deployed drone to dispatch, the drone control system 440 operates with operator control 442 in an example to conduct inspections of the area or equipment around the estimated location of the detected fault or other problem. Based on control information received from the operator control 442, the drone control system 440 operates with the selected drone via a drone communications system 444. In general, the drone control system 440 is able to control the flight of the drone via any suitable communications system from a distance.

The drone control system 440 further receives observation data from the drone performing the observations. Such information in various examples is able to include image data, sound data, other environmental data, or combinations of these. Data obtained from the drone operations is provided to an analytics component 446 in an example. In various examples, the analytics component 446 is able to process received data fully or partially autonomously, with the aid of human analyst or specialists, fully by human analysts or specialists, or combinations of these.

An image analysis system 448 in an example receives image, video, or both, observations made by a drone of the area or equipment around an estimated location of a fault or other problem. Such analyses of image or video data is able to include analysis by fully or partially automated means, analysis with the aid of human analyst or specialists, analysis by human analysts or specialists, or combinations of these.

A trouble ticket generation system 450 in an example receives information produced by the analytics component 446, the image analysis system 448, the report receiver 420, or combinations of these. The data produced by such reports or analyses is able to better define the problem and provide a better definition of the location of that problem to provide more relevant information for the trouble ticket.

The trouble ticket generated by the trouble ticket generation system 450 in an example is provided to a repair crew dispatch system 460 to cause repair personnel to be dispatched to perform repairs of the problem.

Figure 5:
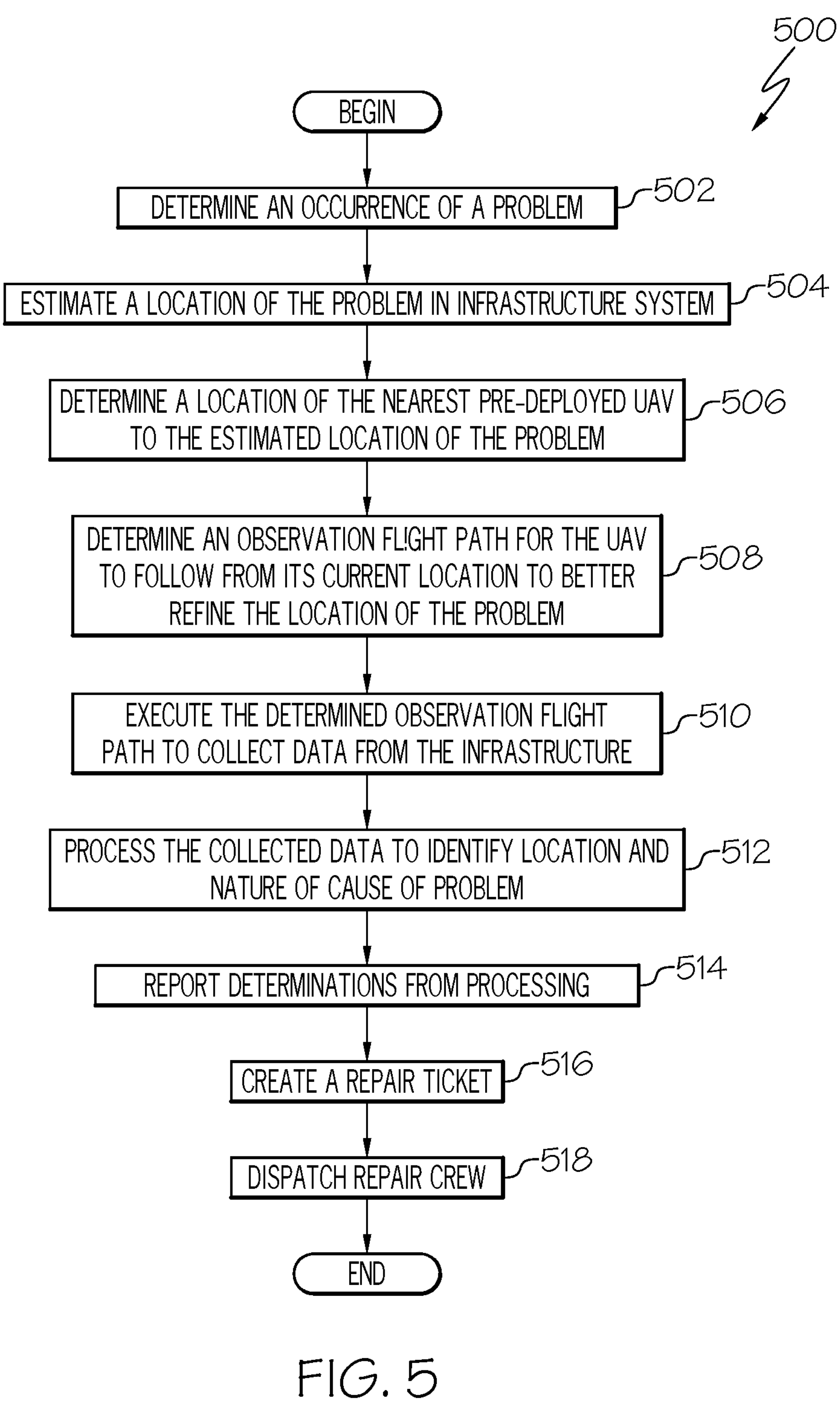
FIG. 5 illustrates a monitoring and UAV dispatch process, according to an example.

FIG. 5 illustrates a monitoring and UAV dispatch process 500, according to an example. The monitoring and UAV dispatch process 500 is an example of a process performed by one or more processors within the above described electrical distribution system monitoring system control center 400.

The monitoring and UAV dispatch process 500 determines, at 502, an occurrence of a problem in an infrastructure system. An example of such a determination is a report from an electrical distribution system monitoring system that reports occurrences of faults and general possible locations of those faults.

A location of the problem in an infrastructure system is estimated, at 504. Examples of estimating locations of problems in an electrical distribution system are described above.

A location of the nearest pre-deployed UAV to the estimated location of the problem is determined, at 506. Such a determination is able to be based on distances between the estimated location of the determined problem and locations of pre-deployed drones, such as UAVs, and selecting the closest drone or basing the decision on other criteria.

An observation flight path for the UAV to follow from its current location to identify and better refine the location of problem is determined, at 508. Such flight paths are able to be determined by any suitable technique.

The determined observation flight path is executed, at 510, to collect data from the infrastructure. Execution of the observation flight path in various examples includes maneuvering a UAV or other vehicle along or near the observation flight path to observe the condition or other features of the area near the estimated location of the problem, observe equipment such as infrastructure components in that area, or combinations thereof, to aid in better determining the location and nature of the determined problem. Maneuvering in various examples is able to be autonomous or machine assisted operations under the control of an operator. In some examples, the observation flight path is able to be modified during its execution due to any cause such as to make additional observations due to, for example, observations made during the observation flight path execution.

Data collected during the observation flight path execution is able to include any type of data, such as but not limited to imagery such as photos, videos, other imagery, or combinations of these. Further types of data can include electric field measurements, other physical observations such as Lidar, Radar, other sensor data, or combinations of these.

The collected data is processed, at 512, to identify location and nature of cause of problem. In some examples, such processing is able to include one or more of automated image processing, automated processing of various types of data collected by the UAV during its observation flight, examination of the data by a person using various techniques, other processing, or combinations of these.

Determinations resulting from processing of collected data are reported, at 514. Such determinations are able to be in the form of a specification of observed damage or other abnormality in particular pieces of infrastructure equipment, observed potential causes of the determined problem or other problems, or combinations of these. In various examples, the location of potential problems or abnormalities is also reported.

A repair ticket is created, at 516. Such a repair ticket is able to include various information, for example but without limitation, one or more of a location of an observed problem or abnormality, a type of problem or abnormality observed at that location, other characterizing data, or combinations of these.

A repair crew is dispatched, at 518. The repair crew is dispatched based on the created repair ticket. The improved information provided in the repair ticket generated by the above described process advantageously allows better selection of the skills required by the repair crew to address the detected problem and improves the direction of the repair crew to the actual location of the problem to allow the repair crew to more quickly find and arrive at the location of the problem to take any actions. The monitoring and UAV dispatch process 500 then ends.

Figure 6:
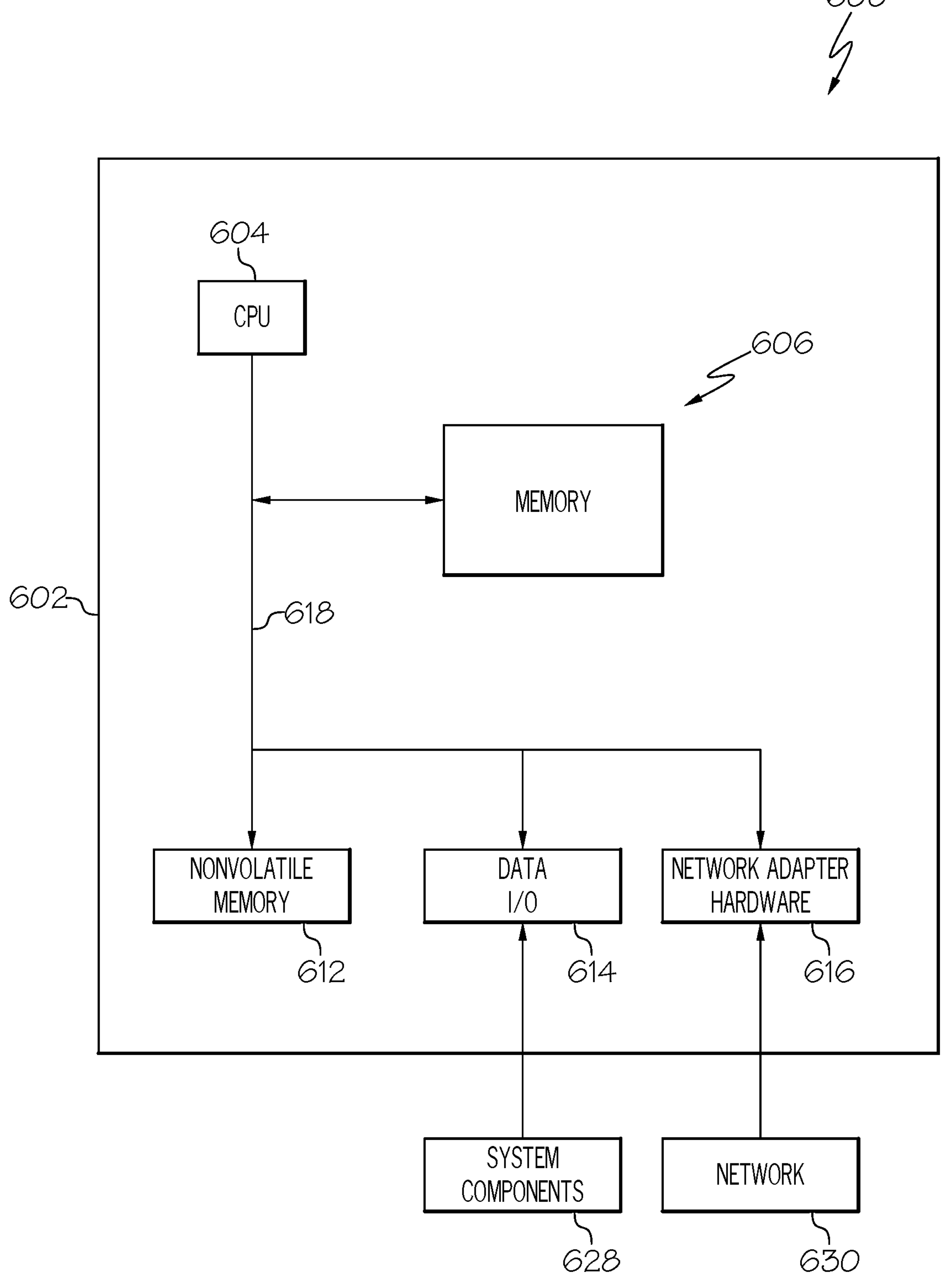
FIG. 6 illustrates components contained within an example wind turbine nacelle, according to an example.

FIG. 6 illustrates a block diagram illustrating a controller 600 according to an example. The controller 600 is an example of a processing subsystem that is able to perform any of the above described processing operations, control operations, other operations, or combinations of these.

The controller 600 in this example includes a CPU 604 that is communicatively connected to a main memory 606 (e.g., volatile memory), a non-volatile memory 612 to support processing operations. The CPU is further communicatively coupled to a network adapter hardware 616 to support input and output communications with external computing systems such as through the illustrated network 630.

The controller 600 further includes a data input/output (I/O) processor 614 that is able to be adapted to communicate with any type of equipment, such as the illustrated system components 628. The data input/output (I/O) processor in various examples is able to be configured to support any type of data communications connections including present day analog and/or digital techniques or via a future communications mechanism. A system bus 618 interconnects these system components.

In other examples, azimuth offset may be based not only on wind direction, but also air temperature, air humidity and other atmospheric affects.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. In general, the computer readable medium embodies a computer program product as a computer readable storage medium that embodies computer readable program code with instructions to control a machine to perform the above described methods and realize the above described systems.

NON-LIMITING EXAMPLES

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A system to monitor infrastructure systems, comprising:

a plurality of pre-deployed drones pre-deployed at pre-deployment locations in an infrastructure system;

a problem location estimation system that is configured to, when operating:

receive indications of an electrical problem in the infrastructure system;

analyze the indications to determine an estimated location of the electrical problem; and an operations system, remote from the pre-deployment locations that is configured to, when operating:

select, based on analysis of the indications, a selected drone from within the plurality of pre-deployed drones, where the selected drone is pre-deployed at a location near the estimated location; and remotely control, based on selection of the selected drone, operations of the selected drone to inspect an area or equipment in a vicinity of the estimated location of the electrical problem, wherein the problem location estimation system is further configured to, when operating:

receive observation data collected by the selected drone;

determine, based on analysis of the observation data, a refined location and details of the electrical problem; and generate a repair ticket to perform repairs on the electrical problem, wherein the repair ticket specifies the refined location of the electrical problem.

2. The system of claim 1, wherein the pre-deployment locations are located across an electrical distribution system.

3. The system of claim 2, wherein the pre-deployment locations comprise power substations.

4. The system of claim 2, wherein the indications of the electrical problem comprise power outage reports from at least one of smart meters or customers.

5. The system of claim 2, wherein the indications of the electrical problem comprise indications of operation of power distribution system overcurrent protection or monitoring devices.

6. The system of claim 5, wherein the overcurrent protection or monitoring devices comprise at least one of protection relays or fault circuit indicators (FCIs).

7. A method of monitoring infrastructure systems, comprising:

receiving indications of an electrical problem in an infrastructure system;

analyzing the indications to determine an estimated location of the electrical problem;

selecting, based on analyzing the indications, a selected drone that is pre-deployed at a location near the estimated location, wherein the selected drone is within a plurality of pre-deployed drones pre-deployed at pre-deployment locations in the infrastructure system;

remotely controlling, based on determining the selected drone, operations of the selected drone to inspect an area or equipment in a vicinity of the estimated location of the electrical problem;

receiving observation data collected by the selected drone;

determining, based on analysis of the observation data, a refined location and details of the electrical problem; and generating a repair ticket to perform repairs on the electrical problem, wherein the repair ticket specifies the refined location of the electrical problem.

8. The method of claim 7, wherein the pre-deployment locations are located across an electrical distribution system.

9. The method of claim 8, wherein the pre-deployment locations comprise power substations.

10. The method of claim 8, wherein the indications of the electrical problem comprise power outage reports from at least one of smart meters or customers.

11. The method of claim 8, wherein the indications of the electrical problem comprise indications of operation of power distribution system overcurrent protection or monitoring devices.

12. The method of claim 11, wherein the overcurrent protection or monitoring devices comprise at least one of protection relays or fault circuit indicators (FCIs).

13. A computer program product for monitoring infrastructure systems, the computer program product comprising:

a non-transitory computer readable storage medium having computer readable program code embodied therewith, the computer readable program code comprising instructions that, when executed by a processor, cause the processor to perform operations comprising:

receiving indications of an electrical problem in an infrastructure system;

analyzing the indications to determine an estimated location of the electrical problem;

selecting, based on analyzing the indications, a selected drone that is pre-deployed at a location near the estimated location, wherein the selected drone is within a plurality of pre-deployed drones pre-deployed at pre-deployment locations in the infrastructure system; and remotely controlling, based on determining the selected drone, operations of the selected drone to inspect an area or equipment in a vicinity of the estimated location of the electrical problem;

receiving observation data collected by the selected drone;

determining, based on analysis of the observation data, a refined location and details of the electrical problem; and generating a repair ticket to perform repairs on the electrical problem, wherein the repair ticket specifies the refined location of the electrical problem.

14. The computer program product of claim 13, wherein the pre-deployment locations are located across an electrical distribution system.

15. The computer program product of claim 14, wherein the pre-deployment locations comprise power substations.

16. The computer program product of claim 14, wherein the indications of the electrical problem comprise power outage reports from at least one of smart meters or customers.

17. The computer program product of claim 14, wherein the indications of the electrical problem reports comprise indications of operation of power distribution system overcurrent protection or monitoring devices.

* * * * *